(12) United States Patent
Hubert

(10) Patent No.: US 8,382,466 B2
(45) Date of Patent: Feb. 26, 2013

(54) LARGE AREA DISSOLVABLE TEMPLATE LITHOGRAPHY

(75) Inventor: Brian N. Hubert, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 12/722,334

(22) Filed: Mar. 11, 2010

(65) Prior Publication Data

US 2010/0230039 A1 Sep. 16, 2010

Related U.S. Application Data

(60) Provisional application No. 61/159,752, filed on Mar. 12, 2009.

(51) Int. Cl.
*B29C 59/02* (2006.01)
(52) U.S. Cl. .......................... 425/385; 264/293
(58) Field of Classification Search .................. 425/385; 264/293
See application file for complete search history.

(56) References Cited

U.S. PATENT DOCUMENTS

| | | | | |
|---|---|---|---|---|
| 1,665,196 A | * | 4/1928 | Collis | 425/150 |
| 4,512,848 A | * | 4/1985 | Deckman et al | 216/43 |
| 6,849,558 B2 | | 2/2005 | Schaper | |
| 7,345,002 B2 | | 3/2008 | Schaper | |
| 7,374,417 B2 | * | 5/2008 | Kuwabara et al. | 425/385 |
| 7,906,058 B2 | * | 3/2011 | GanapathiSubramanian et al. | 264/313 |
| 2006/0226566 A1 | * | 10/2006 | Kwak et al. | 264/40.1 |
| 2008/0309900 A1 | | 12/2008 | Oliver et al. | |

FOREIGN PATENT DOCUMENTS

KR 2008-0014428 A 2/2008

OTHER PUBLICATIONS

International Search Report and Written Opinion mailed Oct. 19, 2010, in International Application PCT/US2010/027033.

* cited by examiner

*Primary Examiner* — Yogendra Gupta
*Assistant Examiner* — Alison Hindenlang
(74) *Attorney, Agent, or Firm* — Patterson & Sheridan, LLP

(57) ABSTRACT

A method and apparatus for patterning a substrate are provided. A template is formed by applying a precursor material to a patterned master substrate and curing or solidifying the precursor material. The template is detached from the master substrate using a carrier having a curved surface. The template is coated with a patterning material, and is then detached from the carrier and applied to the substrate to be patterned. The template is then dissolved without affecting the patterning material, and the patterning material may thereafter be finished to develop the pattern. In an alternate embodiment, the patterning material may be applied to the substrate and then imprinted using the template.

19 Claims, 5 Drawing Sheets

LARGE AREA DISSOLVABLE TEMPLATE LITHOGRAPHY

CROSS-REFERENCE TO RELATED APPLICATIONS

This application claims benefit of U.S. provisional patent application Ser. No. 61/159,752, filed Mar. 12, 2009, which is herein incorporated by reference.

FIELD

Embodiments of the invention relate to methods and apparatus for patterning substrates. More specifically, embodiments of the invention relate to pattern transfer by physical means for lithography processes.

BACKGROUND

The semiconductor processing industry relies on lithography to create patterns on substrates. As the density of features on substrates increases with the progress of Moore's Law, lithographic methods have been challenged to produce repeatable patterns with smaller features over large areas with high throughput.

Standard lithographic methods utilize a mask to cover portions of the substrate to be protected from patterning radiation. In standard photolithography, a light-sensitive photoresist is applied uniformly over the substrate and then exposed to radiation through a pattern-bearing reticle. The resolution of this process is limited by the wavelength of light used, which is typically 248 nm or 193 nm in conventional UV processes. A historical advantage of many photolithography processes was that an entire substrate could be exposed at once, improving throughput. The key disadvantage today is that current photolithography processes struggle to resolve features smaller than about 50 nm in size. For example, some current photolithography processes may create features smaller than about 50 nm in size, but only over a small field of a substrate. Finer resolution over a large field will be needed for future fabrication at dimensions smaller than 50 nm.

Electron beam, or e-beam, lithography is capable of very fine resolution. A substrate is similarly covered with an e-beam sensitive photoresist and then exposed to e-beam radiation. A disadvantage of this technique is that the exposure must be accomplished by scanning the substrate with a beam of electrons. Each spot on the substrate must be lighted with the beam. This takes time, reduces throughput considerably, and introduces problems of uniformity. Hybrid processes involving UV lithography for larger features followed by e-beam lithography for smaller features may improve the result, but such processes are prohibitively expensive, and only effective when there are significant features of larger dimension. As devices become smaller, features with dimension large enough to be resolved by UV lithography become increasingly rare.

In the manufacture of flat panel displays, for example, large substrates up to and exceeding 1220×1400 mm are currently subjected to optical lithography processes such as proximity printing, step and repeat lithography, multi-lens scanning, and mirror projection. Proximity printing, multi-lens scanning, and mirror projection typically use very large area masks comparable in size to the substrates being processed. These masks may cost up to $1 million each. Moreover, as the masks grow larger, they must be made thicker and heavier to survive handling during the process, and to minimize physical distortion of the mask. In some cases, such physical distortion can only be overcome by using complicated and expensive optics.

Pattern transfer by physical contact is a promising technique for patterning substrates, including large area substrates, at dimensions less than 50 nm and extending up through many tens of microns. A pattern is developed in a template, and then physically applied to the substrate. The template serves as a pattern transfer medium for the patterning process. Efficient, high-throughput methods are still needed, however, to fully implement physical contact lithography for mass production of next generation devices.

SUMMARY

Embodiments of the invention provide an apparatus for patterning a substrate, comprising a master substrate, a substrate support, and a template carrier movable between the master substrate and the substrate support, wherein the template carrier comprises a curved template contact surface having a width and a radius of curvature, wherein a ratio of the radius of curvature to the width of the contact surface is at least about 10:1.

Other embodiments provide a method of patterning a substrate, comprising forming a template having a pattern to be applied to the substrate, attaching the template to a plate-like carrier having a curved surface, coating the template with a patterning material, applying the template coated with the patterning material to the substrate and detaching it from the carrier, dissolving the template, uniformly removing a portion of the patterning material to expose portions of the underlying substrate, treating the exposed portions of the underlying substrate to change either the properties or the topography of the substrate, and removing the patterning material.

Other embodiments provide a processing system for patterning substrates, comprising a first plurality of master substrates, each master substrate containing a pattern to be transferred to one or more final substrates, a second plurality of carriers for moving flexible templates formed from the master substrates, each carrier having a curved template contact surface, and a third plurality of pattern transfer stations, each station having a substrate support, wherein each of the plurality of carriers moves between one or more master substrates and one or more pattern transfer stations.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide methods and apparatus for patterning substrates. Features having dimension from tens of microns to less than about 100 nm, such as less than about 50 nm, or less than about 25 nm, for example between about 1 nm and about 20 nm, or between about 1 nm and about 10 nm, can be resolved using embodiments described herein. In most embodiments, a pattern is transferred to the substrate using a template as the pattern transfer medium. The template will usually be coated with a patterning material and then physically applied to the substrate such that the patterning material contacts the substrate. The template is then dissolved to leave the patterning material, which is then used to create the pattern on the substrate.

Figure 1A:
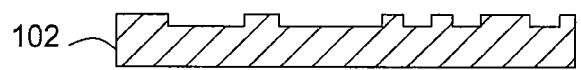
FIGS. 1A-1H are side views of substrates and apparatus engaged in a method according to one embodiment.

In one embodiment, a master substrate is created by forming a pattern in a rigid substrate using a process capable of very fine resolution. A pattern having features smaller than about 50 nm, such as smaller than about 25 nm, or smaller than about 15 nm, for example between about 1 nm and about 20 nm, or between about 1 nm and about 10 nm, may be created in a glass or metal substrate by exposure to an e-beam lithography process. A patterning material sensitive to e-beam treatment is applied to the master substrate in a layer and patterned with an electron beam. The electron beam is capable of defining features having dimension less than 50 nm, such as less than 25 nm, such as about 10 nm or less. The electron beam changes the patterning material such that portions thereof exposed to the beam may be removed, exposing the substrate below. The substrate may then be etched to transfer the pattern to the substrate, or alternately substrate material may be deposited over the exposed portions of the substrate. The etching may be accomplished using an etchant, such as a wet or dry etchant, selected based on the chemistry of the substrate. In most embodiments, a durable rigid master substrate that may be used to create many templates is preferred. FIG. 1A is a schematic side view of a master substrate 102 that has a pattern formed on one surface. In some alternate embodiments, a pattern having features smaller than about 50 nm may be created in a substrate using other processes such as some highly localized photolithography processes.

Figure 1B:
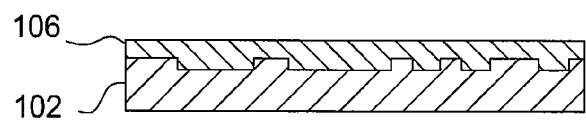

A template is formed having the pattern of the master substrate. A template material is applied to the patterned surface of the master substrate in a way that the interface between the template material and the master substrate reflects the pattern of the master substrate, but the surface of the template material opposite the patterned interface surface is substantially smooth and flat. The template material may generally be applied as a liquid or vapor using a process suited for applying a liquid or vapor layer to a substrate, and is generally a material that may cure, dry, or condense into a flexible solid material. In some embodiments the template material may be a liquid that is applied to the master substrate by spin coating, die coating, slot coating, or extrusion coating. In yet another embodiment, the template material may be deposited as a vapor by physical vapor deposition, chemical vapor deposition, epitaxy, or atomic layer deposition, any of which may be plasma-enhanced. FIG. 1B is a side view illustrating the master substrate 102 with the template 106 disposed thereon.

The template material is generally cured, dried, or treated to form a flexible solid. In some embodiments, the template material may be a polymer that is applied as a liquid and solidifies by curing or drying. For example, polyvinyl alcohol (PVA) may be applied to the master substrate as a water solution and allowed to dry, or encouraged to dry by heating gently. PVA becomes a strong, flexible solid upon drying. PVA may also be made by hydrolysis of polyvinyl acetate. In other embodiments, the template material may be an elastomeric material that may be applied as a liquid or emulsion and dried or cured by heat treatment, or by exposure to light or other radiation. In general, suitable template materials will be removable by a process that does not harm underlying materials. For example, if the template is used to apply a patterning material, a template material is generally chosen that has different solubility or reactivity than the patterning material. A PVA template may be used to apply a resist that is not water soluble, or an elastomeric template may be used to apply a resist that is not soluble in a hydrocarbon.

When the template has solidified, it is removed from the master substrate so it can be used for patterning. A carrier is used to disengage the template from the master substrate in a way that imposes only controlled stresses on the template. The controlled stresses disengage the template such that compensation can be made for any resulting distortion of the pattern expressed in the template. In one embodiment, the carrier is a plate-like article similar in size to the master substrate and the template, with at least one surface having a slight curvature. The curvature may have a single axis, or multiple axes, which may be parallel or intersecting. Examples of curvature include spherical, cylindrical, ellipso-cylindrical, ellipso-spherical, ellipsoid, spheroid, and the like.

In general, the curvature will be small. In many cases, the curved surface is convex. For example, in one embodiment, if a carrier with a curved surface rests on a flat support surface with the center of the carrier contacting the support surface, the edges of the carrier may form a gap with the support surface that is no more than about 1 mm in width. In some embodiments, the carrier surface will have a radius of curvature that is at least 10 times one dimension of the carrier, such as a major dimension of the carrier. For example, in one embodiment, if the carrier has the shape of a square with each side being 3 m in length, the radius of curvature of a cylindrical curved surface will be at least about 30 m. In embodiments with more than one radius of curvature, at least one such radius will be at least 10 times one dimension of the carrier, such as a major dimension of the carrier. In other embodiments, the ratio of a radius of curvature to a surface dimension of the carrier may be at least about 100:1, such as at least 500:1, at least about 1000:1, at least about 1,500:1, and/or at least about 2,000:1. In other embodiments, the ratio of a radius of curvature to a surface dimension may be between about 10:1 and about 2,000:1, such as between about 10:1 and about 100:1, or between about 10:1 and about 1,000:1, or between about 100:1 and about 1,000:1.

In embodiments wherein the curvature has more than one axis, the radius of curvature around each axis may be the same as, or different from, that around other axes. In some embodiments, the curvature may have a conical, spherical, ellipsoidal, or cylindrical shape, or a combination thereof. Moreover, the curvature around different axes may have different senses or directions. For example, the curvature around one axis may be convex while the curvature around another axis is flat, convex, or concave. The opposite side of the carrier, which does not contact the template material, may have a flat or curved shape as well, and may be convex or concave with a conical, spherical, or ellipsoidal shape. In embodiments having more than one axis of curvature, the axes of curvature may be parallel or intersecting.

Figure 1C:
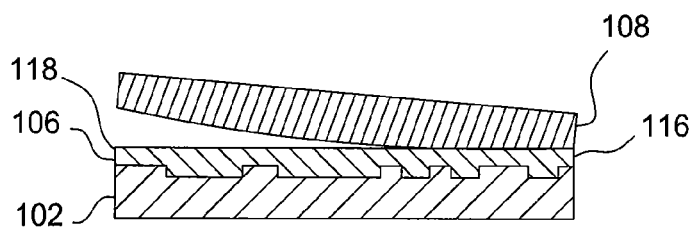
Figure 1D:
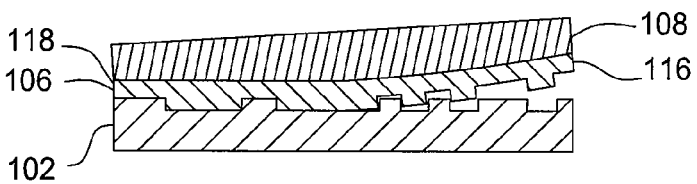

FIG. 1C is a side view illustrating the master substrate 102 with template 106 formed thereon. A carrier 108 is positioned to detach the template 106 from the master substrate 102. The carrier 108 has characteristics substantially similar to those described above, with the surface contacting the template having a slight curvature. The curvature enables the carrier 108 to detach the template 106 from the master substrate 102 by attaching to the template 106 at a first edge 116, rocking across the template 106 so that the carrier 108 contacts the template 106 at a second edge 118 of the template 106, and attaching to the template 106 at the second edge 118. FIG. 1D is a side view illustrating the carrier 108 with the template 106 attached at the first edge 116 and contacting the carrier 108 at the second edge 118. The curved surface of the carrier 108, coupled with the rocking motion of the carrier 108 with the template 106 attached at the first edge 116, detaches the template 106 from the master substrate 102 at the first edge 116 and for some distance along the length of the template 106. As the carrier 108 rocks across the master substrate 102, the template 106 simultaneously adheres to the carrier and detaches from the master substrate at the moving contact point of the carrier and the template. This method of detaching the template 106 from the master substrate 102 results in forces being transmitted to the template 106 that minimize distortion of the template pattern and allow compensation for any such distortions. Wishing not to be bound by theory, it is believed that the forces transmitted to the template by this detaching method are substantially unidimensional and perpendicular to the flat smooth surface of the template 106. This unidimensional force minimizes stresses that tend to distort the pattern formed in the template 106 as it is peeled away from the master substrate 102, and offsets for any such distortions are readily identifiable.

The template 106, attached to the carrier 108, is positioned to receive a coating of a patterning material. The patterning material may, in some embodiments, be a patterning material or a mask material. The patterning material may be applied in any convenient fashion, such as by spin coating, die coating, or extrusion coating of a liquid, spraying on, or vapor depositing. The patterning material is generally applied to form a smooth layer with a patterned interface contacting the patterned template 106. The smooth surface of the patterning material is then applied to a substrate using a technique similar to that used to detach the template from the master substrate. Because the contacting surface of the carrier is curved, the template attached thereto, and the patterning material applied thereon, acquires the curvature of the contact surface of the carrier.

Figure 1E:
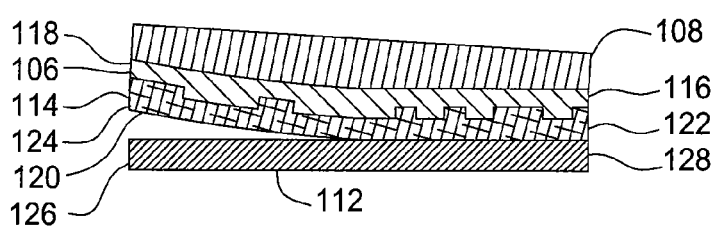
Figure 1F:
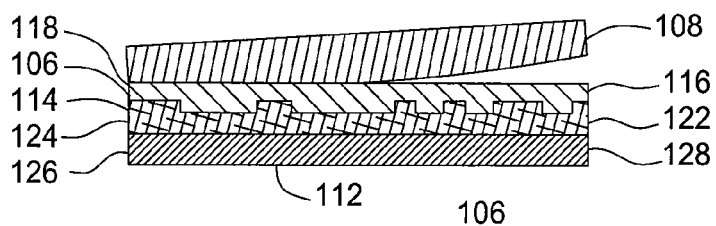

FIG. 1E is a side view illustrating the carrier 108 with the template 106 and patterning material 114 as the patterning material 114 is being applied to the substrate 112. The smooth surface 120 of the patterning material 114 is applied to the substrate 112 by contacting a first edge 122 of the patterning material 114 to a first edge 128 of the substrate 112, detaching the first edge 116 of the template from the carrier 108, attaching the first edge 116 of the template 106, or the first edge 122 of the patterning material 114, to the substrate 112, or to a support (not shown) holding the substrate 112. As shown in FIG. 1F, the carrier 108 is then rocked across the substrate 112 to contact a second edge 124 of the patterning material 114 to a second edge 126 of the substrate 112, detaching the second edge 118 of the template 106 from the carrier 108, and attaching the second edge 118 of the template 106, or the second edge 124 of the patterning material 114, to the second edge 126 of the substrate 112, or to a support (not shown) holding the substrate 112. In some embodiments, the patterning material 114 may be partially or fully cured or dried prior to, and/or after, transfer to the substrate 112.

Figure 1G:
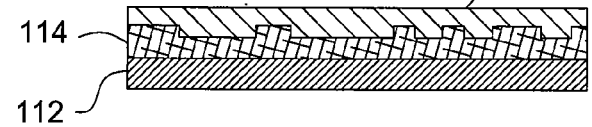
Figure 1H:
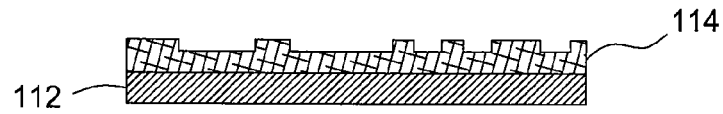

FIG. 1G is a side view illustrating a substrate 112 with a patterning material layer 114 applied thereto, and a patterning template 106. In an embodiment wherein the template 106 is formed from a material with different solubility from the patterning material 114, the template 106 may be removed by dissolving to leave the patterning material layer 114, as shown in FIG. 1H. If the template material 106 is formed from PVA, as described above, it may be readily dissolved by water. If the template material 106 is formed from a hydrocarbon-soluble material, a hydrocarbon wash may remove it. In some embodiments, the substrate may be dipped in a solvent bath. In other embodiments, the solvent may be flowed across the substrate surface. In still other embodiments, the substrate surface may be placed in contact with a solvent bath without dipping the entire substrate. In still other embodiments, the dissolving process may comprise combinations of these techniques.

In alternate embodiments, the template 106 may be formed from a material having different chemistry from the patterning material 114 such that the template 106 has different etch characteristics or different reactions with chemical vapor or plasma from the patterning material 114. In an embodiment wherein the template 106 is formed from a material having different etch characteristics from the patterning material 114, the template 106 may be selectively etched using a chemistry having etch selectivity for the template material over the patterning material. In yet another embodiment, the template 106 may be formed from a material having a different reactivity to a chemical vapor or plasma from the patterning material 114, such that the template material may be chemically altered by exposure to such chemical vapor or plasma, and then removed by dissolving in liquid or etching.

After removal of the template 106, the patterning material 114 may be removed incrementally to expose portions of the substrate 112 beneath the thinner portions of the patterning material 114 while leaving those portions of the substrate 112 beneath the thicker portions of the patterning material 114 covered. The substrate 112 may then be subjected to etching or any other process designed to change the properties of the exposed portions thereof, such that the pattern is transferred from the master substrate 102 to the substrate 112. In some embodiments, the different thicknesses of the patterning material may be used for differential masking without removing the patterning material and without exposing any portion of the substrate. The different thicknesses provide different permeability to process conditions that may be used to process or pattern the substrate.

The patterning material 114 may be removed from the substrate 112 after patterning, or it may remain on the substrate 112 to become an integral part of the eventual device. In embodiments wherein the patterning material 114 is to remain on the substrate 112, the patterning material may be formed from a material that is useful as a functional part of the eventual device. In some embodiments, the patterning material 114 may be an optical material applied to a glass, quartz, or plastic substrate as a functional layer.

Figure 2A:
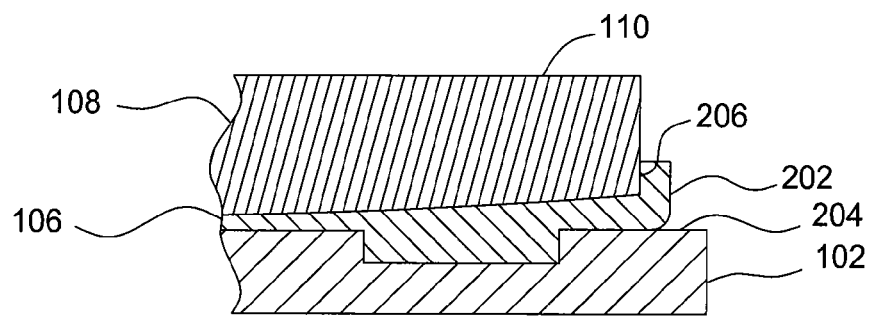
FIGS. 2A-2C are detail views of an apparatus performing a method according to one embodiment.
Figure 2B:
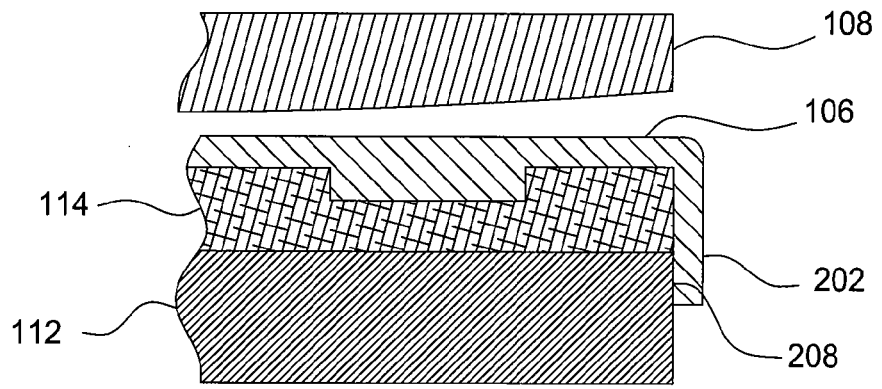

FIGS. 2A and 2B are detail side views illustrating attachment of the flexible template 106 to the template carrier 108 and to the substrate 112 according to one embodiment. As shown in FIG. 2A, the master substrate 102 has a landing zone 204 that extends beyond an edge of the carrier 108. The template 106 is formed with an attachment portion 202 by covering the master substrate 102, including the landing zone 204, with template material. When the template 106 is to be detached from the master substrate 102 and attached to the carrier 108, the attachment portion 202, which may be an attachment strip in some embodiments, or one or more attachment tabs in other embodiments, is adhered to an attachment zone 206 of the carrier 108. Attachment of the template 106 to the carrier 108 may be accomplished by any convenient method, such as by applying an adhesive between the attachment portion 202 of the template 106 and the attachment zone 206 of the carrier 108, or by drying, curing, melting, chemical bonding, heating, or cooling the template material while in contact with the attachment zone 206. In other embodiments, attachment of the template 106 to the carrier 108 may be accomplished by fastening the attachment portion 202 of the template 106 to the attachment zone 206 of the carrier 108 using a fastener, such as a clamp. In some embodiments, the attachment zone 206 of the carrier 108 may feature a recessed portion mated with a ring fastener to hold the attachment portion 202 of the template 106 securely to the attachment zone 206. In some embodiments, the attachment portion 202 of the template 106 may extend around the edge of the carrier 108 to reach and attach to the obverse side 110 of the carrier 108 opposite the curved template contact surface.

The attachment and detachment operations generally happen at certain points of the pattern transfer process. In the embodiment of FIGS. 1A-1H, an attachment operation as illustrated in FIG. 2A may take place when the carrier 108 contacts the template 106 at the first edge 116. An attachment portion at the first edge 116 may be attached to the attachment zone of the carrier to facilitate release of the template 106 from the master substrate 102. The second edge 118 of the template may likewise be attached to the carrier in the configuration of FIG. 1D. The respective edges of the template may likewise be detached from the carrier, and either the template or the pattern material attached to the substrate or a substrate support in the configurations of FIGS. 1E and 1F.

Figure 2C:
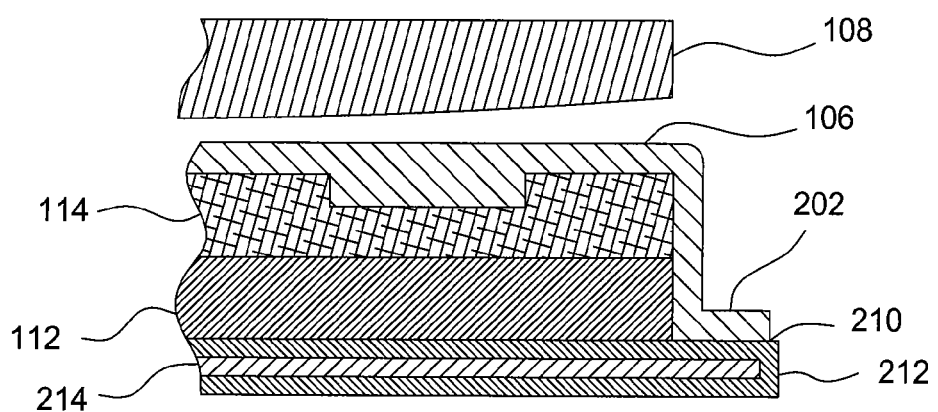

FIG. 2B illustrates how the template 106 may be attached to a substrate 112 in conjunction with detaching from the carrier 108. When the carrier 108 is positioned so that the template 106 with the patterning material 114 applied thereto contacts the substrate 112 at the first edge 208, the attachment portion 202 of the template 106 is detached from the carrier 108 and attached to the substrate 112. In some embodiments, the attachment portion 202 of the template 106 may extend beyond the substrate 112 and attach to a substrate support below, as shown in FIG. 2C, or along one edge of, the substrate. In other embodiments, the attachment portion 202 of the template 106 may extend beyond the edge of the substrate 112 to the side of the substrate 112 opposite the side contacting the patterning material 114. In all these embodiments, the template may be secured to the substrate 112 or the support on which it rests, by adhesive, fasteners, chemical bonding, melting, curing, drying, heating, or cooling as described above. When the template 106 is secured to the substrate 112, the carrier 108 may detach from the template 106 by rocking across the template 106, creating the gap between the carrier 108 and the template 106 shown in FIG. 2B. In another embodiment shown in FIG. 2C, the substrate support 212 may have a landing zone 210 extending beyond one or more edges of the substrate 112 to which the attachment portion 202 of the template 106 may adhere.

In some embodiments, attachment and detachment of the template from the master substrate and template carrier may be facilitated by surface modifications of the template, template carrier, master substrate, patterning material, substrate, or any of the above. In one embodiment, creating texture on the surface of the template that contacts the carrier may facilitate detachment of the template from the carrier at the appropriate time. Such texture may be created by abrading, scoring, or otherwise mechanically altering the surface, or by applying a chemical release agent to the surface. If a release agent is to be used, it may be helpful to use a release agent with similar solubility to that of the template. For example, if the template is water soluble, a water soluble release agent, such as a fatty acid material, or a soap powder, may be useful. In some embodiments, the contact surface of the carrier may also be altered to facilitate adhesion or release. For example, a coating may be added to the master substrate surface, carrier contact surface, substrate contact surface, substrate support surface, or any or all of them to promote adhesion or release, depending on the embodiment. In some instances, one or more of those surfaces may feature openings through which vacuum or pressure may be applied to promote adhesion or release. In some embodiments, the template material may include a magnetic material that can be magnetically coupled to a carrier having magnetic properties to promote adhesion. The carrier may have transient magnetic properties, such as through a powered magnetic assembly, for promoting adhesion or release at appointed times. For example, a magnetic assembly may be powered with an attractive polarity to promote adhesion of a magnetic template, and then powered with a repulsive polarity to promote release. In another example, the master substrate, template carrier, substrate, or substrate support may be electrically biased to promote a transient electrostatic adhesion. In other embodiments, the reversible attachment and detachment means described above may also be applied to the landing zones and attachment zones described in connection with FIGS. 2A-2C.

In one embodiment, electrostatic means are used to hold the template securely against the carrier and/or the substrate support. The template carrier may be configured with one or more bias members, such as a conductive template contact surface coated with a dielectric material or a conductive bias member embedded in the carrier. The one or more bias members may be coupled to one or more power sources for applying electrical bias to the template carrier. In operation, power is applied to the template carrier when it contacts one edge of the template, and the electrostatic force generated on the template adheres the template to the carrier and detaches it from the master substrate as the carrier rolls across the template. In some embodiments, one or more bias members may have sections separated by insulators to allow individual sections of the carrier to be powered independently. This may facilitate carrier loading and unloading in ways described herein. In particular, a template adhered to a sectional electrostatic carrier may be applied to a substrate by contacting one edge of the template to the substrate and successively de-energizing sections of the carrier as the carrier rolls across the substrate. As sections of the carrier are de-energized, the template detaches from the carrier and lays on the substrate. FIG. 4C is a schematic cross-sectional view of a template carrier 440 according to an embodiment. The template carrier 440 has a template contacting surface 442 and a bias member 444 disposed in the carrier 440. The bias member 444 of FIG. 4C comprises conductive sections 444A separated by insulating spacers 444B to allow the bias member 444 to be powered by section. In this way, electrical bias may be established in parts of the carrier to facilitate attachment and detachment of a template thereto. In some embodiments, electrical bias may be reversed by section to facilitate attachment of the template at one portion of the carrier and detachment at another portion.

Electrostatic means may also be used to adhere the template to the substrate or substrate support. The embodiment of FIG. 2C illustrates a substrate support 212 configured to apply electrostatic force. One or more bias members 214 may be disposed in the substrate support 212 to generate electrical bias to adhere the substrate and template to the substrate support. As described above, the one or more bias members 214 may be sectional to allow partial biasing. In one aspect, the bias member 214 may be powered to hold the substrate 112 and the template 106 securely against the substrate support 212 by electrostatic force. As the carrier 108 releases the template 106, and the template 106 is positioned proximate the substrate support 212, the bias adheres the template 106 to at least the landing zone 210 by electrostatic force. In some embodiments, the bias may apply substantial electrostatic force to all locations of the template, not just the attachment portion 202.

Embodiments described herein provide a method of patterning a substrate, comprising forming a template having a pattern to be applied to the substrate, attaching the template to a carrier having a curved surface, coating the template with a patterning material, applying the coated template to the substrate and detaching the coated template from the carrier, and dissolving the template. The template is generally formed by solidifying a liquid precursor applied to the patterned surface of a master substrate, such that the solidified template acquires the pattern of the master substrate. In some embodiments, the template is attached to the carrier by attaching the template to a first edge of the carrier and then attaching the template to a second edge of the carrier. After attaching the template to the first edge of the carrier, the carrier is rocked across the template until the second edge of the carrier contacts the template. The template is coated with a patterning material, which may be a resist, and the coated template is applied to a substrate to be patterned. A first edge of the coated template is placed in contact with the substrate, and the template is detached from the carrier and attached to the substrate or substrate support. The carrier is rocked across the substrate until a second edge of the coated template contacts the substrate, after which the template is detached from the carrier and attached to the substrate support. The template is then dissolved, leaving the patterning material coating the substrate. The patterning material can then be used to pattern the substrate.

The template is generally formed by solidifying a liquid precursor applied to the patterned surface of a master substrate. The master substrate may be made of any durable material, such as a glass or a metal, and may be patterned by any high-resolution patterning process, such as an e-beam process. The template precursor liquid may be a curable liquid, such as a liquid that solidifies upon drying or exposure to heat, light, or radiation. In one embodiment, PVA may be used as the template precursor. In another embodiment, a polymer may be applied in a liquid or emulsified state. The liquid may be cured by drying or exposure to heat or light. In the case of PVA, drying causes the liquid to solidify into a flexible solid template. In the case of a polymer, drying may solidify the polymer by evaporating solvent, or applying heat may cause a curing chemical reaction, such as cross-linking of polymer chains, to form a flexible solid. The solid template bears the pattern of the master substrate by virtue of the liquid having flowed into the pattern recesses formed in the master substrate prior to solidifying. The liquid template precursor may be applied to the master substrate by spin coating (i.e. spinning the master substrate while pouring the liquid onto the master substrate), by die coating (i.e. dispensing the liquid precursor through an elongated die having a length approximately the same as one dimension of the master substrate as the die traverses the master substrate), by extrusion coating (i.e. die coating wherein the master substrate moves beneath the extrusion die), or by vapor deposition such as chemical vapor deposition (CVD, PECVD, MOCVD), atomic layer deposition, or physical vapor deposition. In general, the template precursor liquid fills the pattern recesses of the master substrate and forms a smooth flat coating over the master substrate.

In many embodiments, the curable liquid template precursor is applied to a landing zone surrounding the patterned area of the master substrate. When the template is cured, the portion applied to the landing zone becomes an attachment portion of the template. The attachment portion may be useful in facilitating attachment of the template to the carrier and to the substrate support. For example, if the attachment portion of the template is a strip around the circumference of the template, the strip may be adhered to the carrier head using adhesive or by using a fastener. The strip may be inserted, for example, beneath a clamp on the carrier or on the substrate support to attach the template to either. In other embodiments, the attachment portion may be one or more tabs that may be attached by adhesive or clamping in a similar manner.

The template is detached from the master substrate by attaching it to the carrier, and then using the carrier to incrementally detach the template from the master substrate by applying a substantially unidimensional force to the template. In one embodiment, the carrier is placed into contact with the template at a first edge. The template is detached from the master substrate and attached to the carrier at the first edge. If the template has an attachment portion, as described above, the attachment portion may be detached from the master substrate and attached to the carrier. In some embodiments, the carrier may have an attachment zone on an edge thereof, or on the side of the carrier opposite the surface that contacts the template. Attachment of the template to the carrier may be accomplished using adhesive or by clamping.

The surface of the carrier that contacts the template will usually be curved to facilitate application of the unidimensional separating force. The curvature may be uniaxial or multiaxial. In some embodiments, a carrier surface with uniaxial curvature may be most useful. In other embodiments, a carrier surface with spherical or conical curvature may be useful. The carrier contact surface is placed into contact with the template at a first edge, and the template attached to the carrier. The carrier is then rocked or rolled across the template. As the carrier rolls across the template, the carrier applies a separating force to the template, which separates from the master substrate without damage or distortion. The separating force applied by the carrier is generally free of any shear which might distort the pattern formed in the template.

The curvature of the template contacting surface of the carrier is generally slight. For most applications, if the carrier rests on a flat surface, contacting the surface at its center point, a gap between the edges of the carrier and the flat surface of about 1 mm. or less will serve to manipulate the template. In many embodiments, the radius of curvature may be about 1,000 times the dimension of the carrier surface that has the contour. For example, a square carrier 1 meter on a side may have a radius of curvature of at least 1,000 meters. In some embodiments, a radius of curvature of the template contacting surface may compare to a major dimension of the carrier in a ratio of at least about 1,000:1, such as a ratio of at least about 1,500:1, for example a ratio of at least about 2,000:1.

Rocking the carrier across the template comprises rotating the carrier around an axis of rotation. In the case of a rectangular carrier attaching to a rectangular template, the carrier is rotated about an axis perpendicular to the direction of "peel". For example, if the template is to be detached from the master substrate progressively from a first edge to a second edge, the carrier is attached to the template at the first edge and rotated about an axis perpendicular to a line drawn between midpoints of the first and second edges. As the carrier rocks across the template, a line of contact traverses across the template contact surface of the carrier. As the line of contact passes a point on the template, the carrier begins pulling away from the master substrate, exerting a separating force tending to pull the template away from the master substrate. The rocking motion of the carrier is calibrated to translate the carrier in a direction perpendicular to the axis of rotation. For example, the carrier may be translated while rocking such that the center of rotation translates with the line of contact.

If the curvature of the carrier surface contacting the template is smooth, each point on the carrier surface follows a generally cycloidal path near the template surface, approximating the shape of a cycloid near a cusp. Each point may therefore be thought of as moving in a direction substantially perpendicular to the template surface contacting the carrier surface. This motion generates a pulling force on the template that is also substantially perpendicular to the template surface contacting the carrier, and substantially perpendicular to the plane described by the surface of the master template, which may be thought of as "horizontal". As such, this pulling force is substantially unidimensional and perpendicular to the plane of the master template. The force is primarily tensile in character, pulling the template away from the master substrate, but local shear forces may be realized in areas where the template is detached from pattern features having a profile that is vertical or that departs appreciably from the horizontal. Because the pulling force applied to the template is substantially perpendicular to the "horizontal" plane of the master substrate, compensation can be engineered for any distortion of the template pattern introduced by detaching from the master substrate.

In embodiments featuring a template separation process wherein the carrier rocks from a first edge to a second edge of the template, when the second edge of the carrier contacts the second edge of the template, the second edge of the template is detached from the master substrate and attached to the carrier by virtue of the attachment portion described above. In some embodiments, it may be useful to attach the template to the carrier around its entire circumference to minimize any tendency to sag or droop, thereby minimizing potential pattern distortions as the template is manipulated. In some embodiments, attachment of the template to the carrier may be enhanced by use of adhesive or by vacuum. In other embodiments, it may be useful to endow the template with magnetic properties, for example by embedding magnetic material in the template, and adhere the template to the carrier by application of magnetic force.

In some embodiments, the template attached to the carrier head is used to transfer a pattern to the final substrate. In other embodiments, the template may be used to imprint a pattern onto the substrate. For example, a patterning material may be applied to the substrate and the template applied to the patterning material to form a pattern. In other embodiments, a patterning material may be applied to the template and the coated template applied to the substrate. In either case, the patterning material will have some resistance to the process or processes to be used to pattern the substrate. The patterning material will generally be applied as a liquid, spin coated, die coated, extrusion coated, or sprayed onto either the template or the substrate, or as a vapor, deposited onto either the template or the substrate in a vapor deposition process, and may be partially or completely cured or dried before, during, and/or after application of the template to the substrate. When applied to the template, the patterning material acquires the pattern of the template by filling the pattern recesses in the template and forming a smooth surface covering the template. When applied to the substrate, the patterning material will acquire the pattern of the template as the template is contacted with the patterning material, the patterning material flowing under pressure of the contact force to fill the pattern recesses. If the patterning material is a viscous liquid, the contact force required to fill the pattern recesses will be greater than when the patterning material is a non-viscous liquid. In one embodiment, the patterning material may be a non-viscous liquid that is cured after the pattern template is applied to the patterning material. In either case, the template and patterning material are eventually applied to the substrate.

The template, coated or uncoated, is generally applied to the substrate, or the resist-coated substrate, by a process similar to that used to detach it from the master substrate. The template, coated or uncoated, follows the curvature of the template contact surface of the carrier. Thus, the template may be detached from the carrier and attached to the substrate by contacting the template to the substrate at a first edge, detaching the first edge of the template from the first edge of the carrier and attaching it to the first edge of the substrate or the substrate support, rocking the carrier across the substrate until the second edge of the template contacts the second edge of the substrate, detaching the second edge of the template from the second edge of the carrier and attaching it to the second edge of the substrate or substrate support. In many instances, precise alignment of the template on the substrate may be achieved through use of alignment processes known to the art.

In some embodiments, it may be useful to facilitate adhesion and/or release of the template from the carrier through surface modification. To promote adhesion, an adhesive may be applied to the template or the template contact surface of the carrier, or materials may be selected for construction of either to promote adhesion. To promote release of the template from the carrier, the surface of the template may be roughened by abrasion or scoring, or the template contact surface of the carrier may be roughened through abrasion or scoring, or during manufacture. Additionally, a release agent such as a powder or chemical may be coated onto the template, the template contact surface of the carrier, or both. A release agent will usually have solubility similar to that of the template. For example, if the template is water soluble, the release agent will generally also be water soluble, such as a fatty acid or soap powder, to facilitate complete removal with the template.

In some embodiments, one or more forces may be applied to aid in attaching the template to the carrier and detaching it from the carrier. A force delivery member may be included in any of the template carrier, the master substrate, or the substrate support to facilitate applying forces to the template for attaching and detaching. In one embodiment, the force delivery member comprises a pneumatic member. Openings may be provided in the template contact surface of the carrier, for example, to apply vacuum to the back side of the template to promote adhesion. In another embodiment, the template contact surface may comprise a porous, microporous, or nanoporous material capable of transmitting positive or negative pressure (e.g. vacuum). In lithographic processes featuring very small features, a nanoporous template contact surface may minimize stress concentration points capable of distorting the template pattern when pressure or vacuum is applied. In another embodiment, if the template is constructed of a magnetic material, the template carrier may comprise a magnetic member, such that a magnetic field may be applied to adhere the template to the carrier. In another embodiment, an electrical bias generating member may be included in the template carrier to generate an electrostatic adhesion force on the template. In each case, the adhesion force may be converted into a repulsive force by reversing the action thereof. Pressure may be applied to detach the template from the pneumatic carrier, the polarity of the magnetic carrier may be reversed, or the polarity of the electrostatic bias or magnetic field may be reversed, respectively. Also, in each case, the force delivery member described may be included with the master substrate, the substrate being processed (e.g. a conductive member disposed in the substrate with exposed contacts for providing electrical bias to the substrate), and/or the substrate support in addition to, or instead of, the template carrier. It should also be noted that electrical bias may be imparted to an electrically insulating template merely by imparting an electric charge to the dielectric material of the template.

Figure 4A:
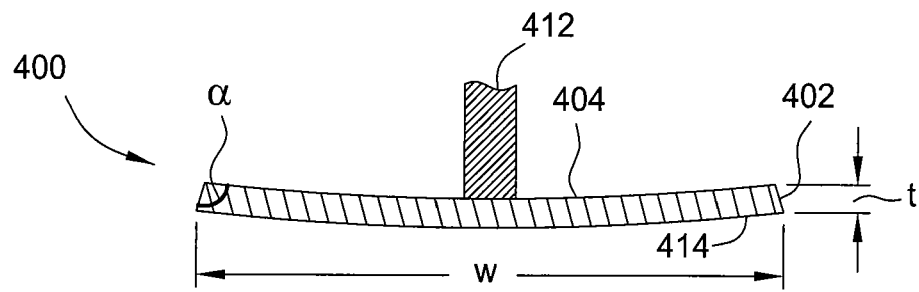
FIG. 4A is a side view of an apparatus according to one embodiment.
Figure 4B:
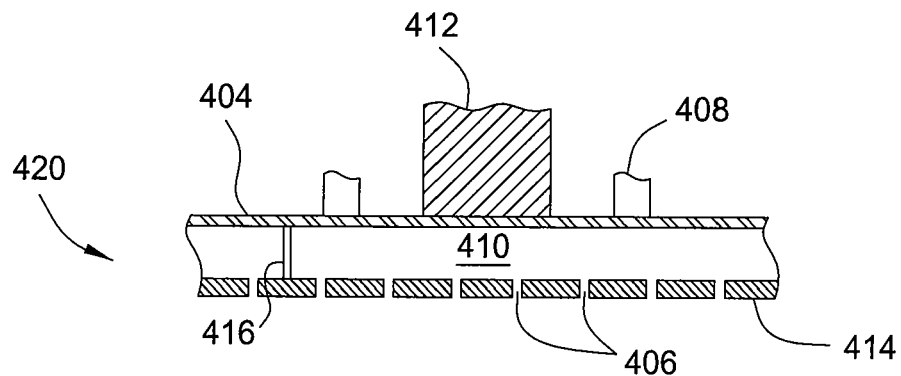
FIG. 4B is a detail side view of an apparatus according to another embodiment.
Figure 4C:
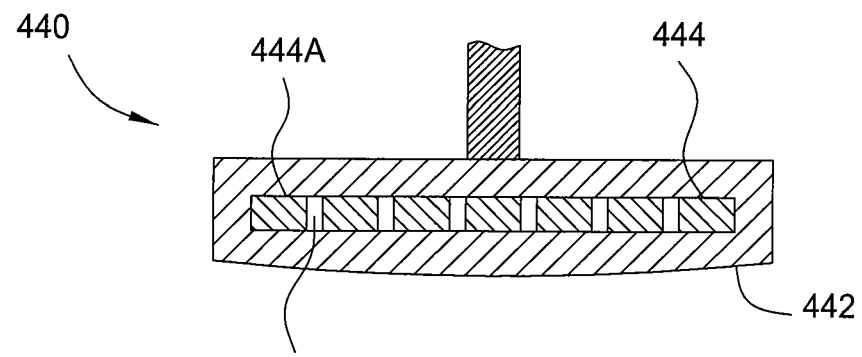
FIG. 4C is a detail side view of an apparatus according to another embodiment.

Some alternative embodiments of carriers are illustrated in FIGS. 4A and 4B. FIG. 4A is a side view of a carrier 400 having a first major surface 404 and a second major surface 414. The second major surface 414 is also a template contact surface, and is curved with a radius of curvature at least about 1,000 times the width w of the second major surface 414. In the embodiment of FIG. 4A, the first major surface 404 is also curved, and may have the same radius of curvature as the second major surface, or a different radius of curvature, either more or less than that of the second major surface 414. The carrier 400 has a thickness t, which may be constant throughout the carrier. It should be noted that the curved first and second major surfaces 404 and 414 may be circular (i.e. arcs of circles) or non-circular. For embodiments in which either the first or second major surfaces are curved with non-circular shape, the thickness t may vary at different points along either surface. In such embodiments, the second major surface 414, forming the template contact surface, may have an average radius of curvature at least about 1,000 times the width w of the second major surface 414, such as at least about 1,500 times the width w, for example at least about 2,000 times the width w. That is to say that the ratio of the average radius of curvature of the second major surface 414 to the width w of the second major surface 414 may be at least about 1,000:1, such as at least about 1,500:1, for example at least about 2,000:1.

The carrier of FIG. 4A has an exemplary support 412 located near a center of the carrier 400. Any convenient support may be used, however, including swivel or rotatable mountings such that the carrier head may move with respect to the support to perform the rocking action for attaching and detaching templates. The carrier 400 has edge portions 402 that may be angled in some embodiments. The edge portions 402 may form an angle α with respect to the first major surface 404, for example, which may be constant at all locations along the periphery of the carrier, or may vary in any desired way. In some embodiments, the edge portions 402 may have a curved profile, if desired. Shaping and angling of the edge portions 402 may be useful in some embodiments to promote adhesion of the attachment portion of the template. In embodiments wherein the edge portion 402 is angled with respect to either the first or second major surfaces 404, 414, the angle may range from near 0°, such as about 5°, to near 180°, such as about 175°. In some embodiments, the angle α will range between about 80° and about 100°.

FIG. 4B is a detail side view of another exemplary carrier 420 configured to apply vacuum or pressure to promote adhesion and release of a template. The carrier 420 has an internal cavity 410 in fluid communication with conduits 408. The embodiment of FIG. 4B has two conduits 408, but any convenient number may be used. The conduits 408 are connected to a gas supply (not shown) for applying pressure, and to a vacuum source (not shown) for applying vacuum, with appropriate piping and valves. The second major surface 414 of the carrier 420 has openings 406 that allow transmission of pressure or vacuum to the interface between the second major surface 414 and a template adjacent thereto (not shown). In an alternate embodiment, the second major surface 414 has no openings, but is flexible, able to change shape through application of pressure or vacuum to the internal cavity 410. Dividers 416 may be disposed in the internal cavity 410 of the carrier 420 to create individual chambers. The individual chambers may be independently pressured or evacuated to adhere or repel the template at the contact surface 414 to facilitate loading and unloading of the carrier 420. In one embodiment, dividers are disposed such that each chamber communicates with only one opening 406. In another embodiment, dividers are disposed such that each chamber communicates with more than one opening.

In still other embodiments, the carrier may be configured as a cylinder-like object with an average radius of curvature large enough to preserve the substantially unidimensional character of forces applied to the template. In such an embodiment, the ratio of the average radius of curvature of the portion of the cylinder-like object that contacts the template to a major dimension of the template will generally be at least about 1:1 to apply substantially unidimensional forces to the template.

In many embodiments, the materials of the master substrate, carrier, and final substrate will be substantially matched to avoid distortions due to temperature. If, for example, the carrier has significantly different coefficient of thermal expansion from the master substrate or the final substrate, and if the temperatures of the two are significantly different, the carrier may expand or contract during or after attaching the template, creating a thermal distortion of the pattern. Matching the thermal properties of the substrates and carriers, and matching temperatures of the various steps and components of the apparatus, minimizes the chance of thermal distortion during patterning.

Figure 3A:
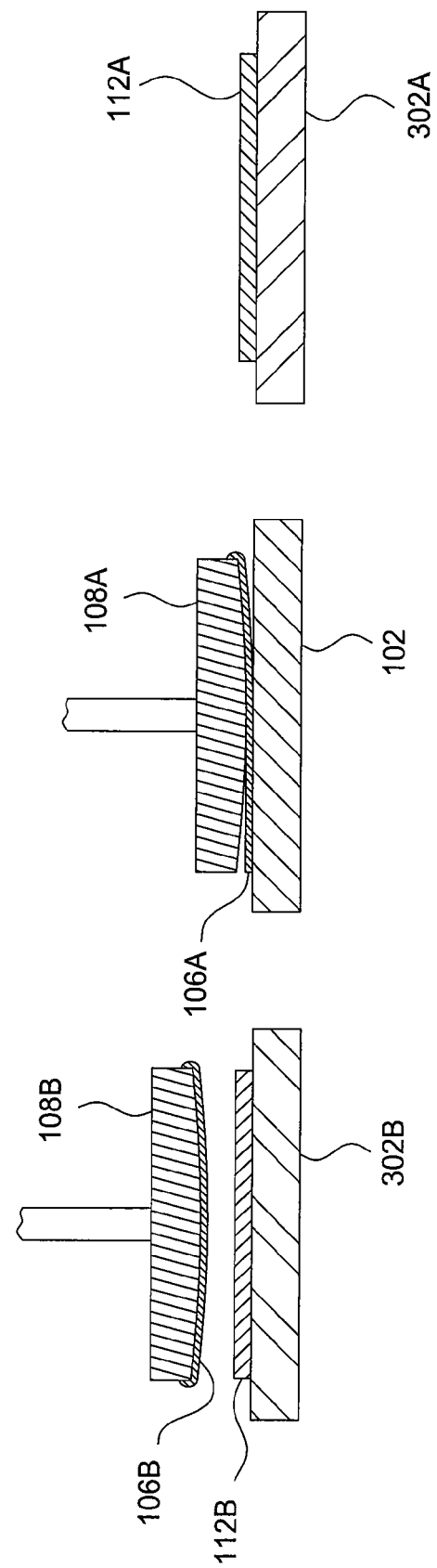
FIG. 3A is a side view of a processing system according to one embodiment.
Figure 3B:
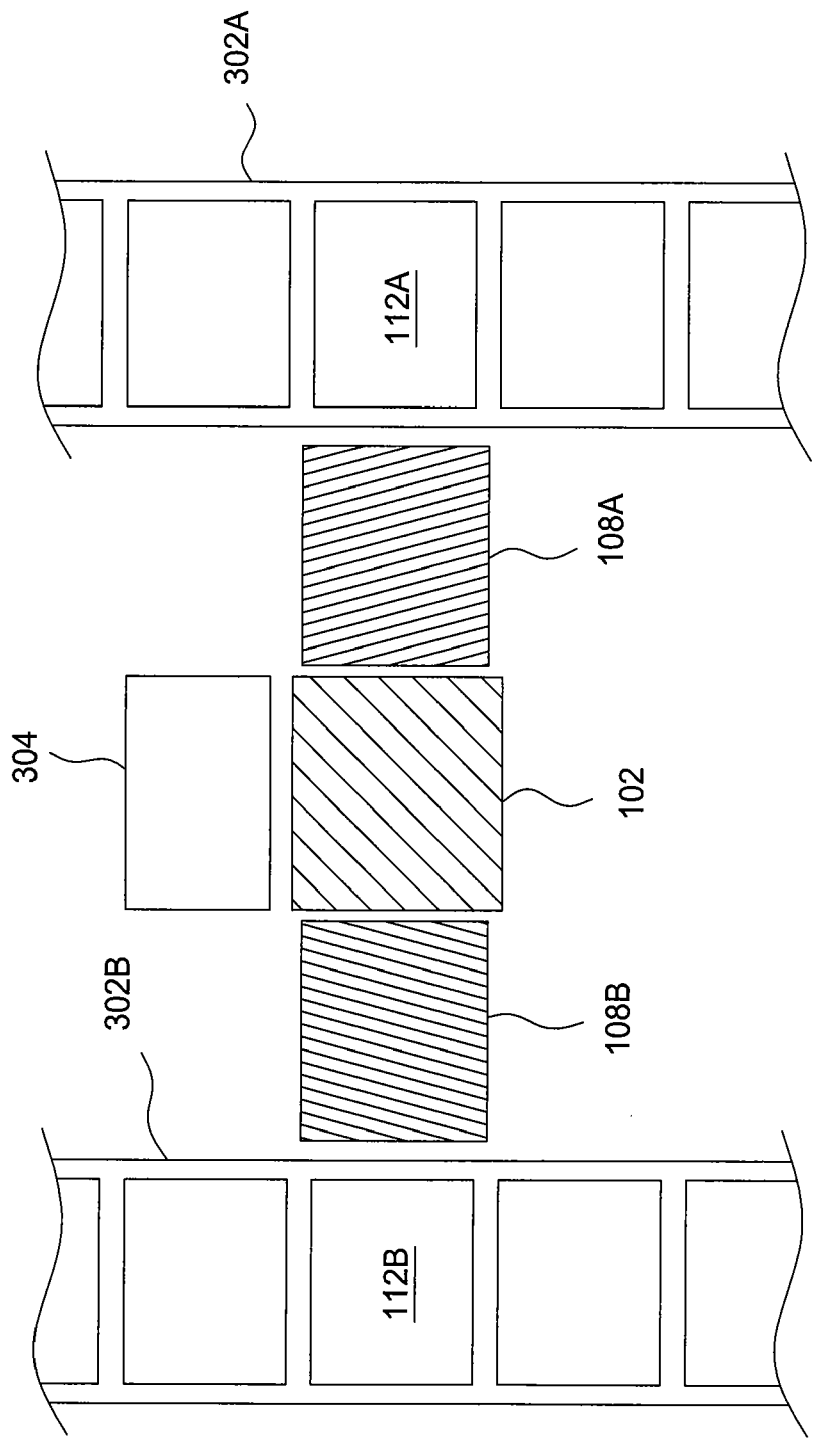
FIG. 3B is a top view of the processing system of FIG. 3A.

FIGS. 3A and 3B show a side view and top view, respectively, of an apparatus for processing substrates according to an embodiment of the invention. In FIGS. 3A and 3B, a single master substrate 102 is engaged by two carriers 108A and 108B to pattern substrates 112A and 112B on supports 302A and 302B, respectively. As can be seen in FIG. 3A, a first carrier 108A may be detaching a first template 106A from the master substrate 102 in preparation for attaching the first template 106A to a first substrate 112A to pattern the first substrate 112A, while a second carrier 108B is using a second, coated, template 106B attached thereto to pattern a second substrate 112B. After the first carrier 108A has detached the first template 106A from the master substrate 102, a new template may be formed on the master substrate 102, and attached to carrier 108B after carrier 108B detaches from the second template 106B. In this way, a single master substrate 102 can be used to pattern multiple substrates efficiently. Patterning material may be applied to the templates 106A and 106B by a coating station (not shown in FIG. 3A) that utilizes any convenient technique, such as spraying, spin coating, ribbon coating, dipping (with or without rocking), and the like.

The embodiment of FIG. 3B illustrates that the substrate supports 302A and 302B may be moving supports that carry successive substrates to patterning stations adjacent to the carriers 108A and 108B. Also shown in the embodiment of FIG. 3B is an application station 304 for patterning material. Either of the carriers 108A/B having attached a template formed using the master substrate 102 may move the template to the application station 304 to receive patterning material.

In some embodiments, a single master substrate may operate with a first plurality of carriers and a second plurality of patterning lines or stations by disposing successive substrates in each patterning station. In some embodiments, the first plurality may be equal in number, or less than, the second plurality. In some embodiments, a single master substrate may be used with one or two carriers and two patterning stations. In other embodiments, a single master substrate may be used with one, two, or three carriers and three patterning stations. In other embodiments, a first plurality of master substrates, a second plurality of carriers, and a third plurality of patterning stations may be used together, with the first, second, and third pluralities being the same or different in number. Each master substrate of the first plurality may have the same pattern, or a different pattern, formed therein. For example, a first master substrate may be used to transfer a first pattern to a substrate, and then a second master substrate may be used to transfer a second pattern to the same substrate. In some embodiments, a plurality of master substrates may be used to transfer a plurality of successive patterns to a single substrate.

While the foregoing is directed to embodiments of the invention, other and further embodiments of the invention may be devised without departing from the basic scope thereof.

What is claimed is:

1. An apparatus for patterning a substrate, comprising:
   a master substrate;
   a substrate support; and
   a template carrier movable between the master substrate and the substrate support, wherein the template carrier comprises a curved template contact surface having a width and a radius of curvature, wherein a ratio of the radius of curvature to the width of the contact surface is at least about 10:1.

2. The apparatus of claim 1, wherein the substrate support comprises a landing zone for holding a template securely against the substrate support.

3. The apparatus of claim 1, wherein the curvature of the template contact surface has one axis.

4. The apparatus of claim 1, wherein the template carrier comprises an attachment zone configured to hold the template securely against the template carrier.

5. The apparatus of claim 1, wherein at least one of the template carrier, the master substrate, and the substrate support comprises a force delivery member.

6. The apparatus of claim 5, wherein the force delivery member comprises an electrical bias generating member.

7. The apparatus of claim 5, wherein the force delivery member comprises a pneumatic member.

8. The apparatus of claim 2, wherein the master substrate comprises a landing zone for forming an attachment portion of a template.

9. The apparatus of claim 1, wherein the template carrier has a curved surface with more than one axis of curvature, and the template carrier comprises a pneumatic force delivery member.

10. An apparatus for creating a pattern on a substrate, comprising:
    a substrate support comprising a landing zone for holding a cured template securely against the substrate support;
    a source of curable template material positioned to deliver curable template material to a master substrate; and
    a plate-like template carrier with one surface that has a slight curvature, wherein the plate-like template carrier receives a cured template from the master substrate.

11. The apparatus of claim 10, wherein the template carrier is movable between the substrate support and the master substrate.

12. The apparatus of claim 10, wherein the template carrier comprises a template fastener.

13. The apparatus of claim 12, wherein the template fastener is a ring fastener.

14. The apparatus of claim 13, wherein the template carrier further comprises a recess that mates with the ring fastener.

15. The apparatus of claim 14, wherein the surface of the plate-like template carrier has a width and a radius of curvature, and a ratio of the radius of curvature to the width is at least about 10:1.

16. An apparatus for patterning a substrate, comprising:
    two or more substrate supports; and
    a plate-like template carrier movable among the two or more substrate supports, the template carrier having a mechanical template fastener and a curved template contact surface that is roughened.

17. The apparatus of claim 16, wherein at least one of the template carrier and the substrate support comprises a force delivery member.

18. The apparatus of claim 17, wherein the force delivery member comprises an electrical bias generating member.

19. The apparatus of claim 17, wherein the force delivery member comprises a pneumatic member.

* * * * *